US012675258B2

(12) United States Patent
Wu et al.

(10) Patent No.: US 12,675,258 B2
(45) Date of Patent: Jul. 7, 2026

(54) CONTROL CIRCUIT, MEMORY SYSTEM, AND OPERATING METHOD

(71) Applicants: TAIWAN SEMICONDUCTOR MANUFACTURING COMPANY, LTD., Hsinchu (TW); NATIONAL TSING HUA UNIVERSITY, Hsinchu City (TW)

(72) Inventors: Jui-Jen Wu, Hsinchu (TW); Yi-Lun Lu, New Taipei City (TW); Win-San Khwa, Taipei City (TW); Meng-Fan Chang, Taichung City (TW); Tai-Hao Wen, New Taipei City (TW)

(73) Assignees: TAIWAN SEMICONDUCTOR MANUFACTURING COMPANY, LTD., Hsinchu (TW); NATIONAL TSING HUA UNIVERSITY, Hsinchu City (TW)

( * ) Notice: Subject to any disclaimer, the term of this patent is extended or adjusted under 35 U.S.C. 154(b) by 87 days.

(21) Appl. No.: 18/733,779

(22) Filed: Jun. 4, 2024

(65) Prior Publication Data

US 2025/0370715 A1    Dec. 4, 2025

(51) Int. Cl.
*G11C 8/08*          (2006.01)
*G06F 7/544*        (2006.01)

(52) U.S. Cl.
CPC .............. *G06F 7/5443* (2013.01); *G11C 8/08* (2013.01)

(58) Field of Classification Search
CPC ............................... G06F 7/5443; G11C 8/08
USPC ...................................................... 365/230.06
See application file for complete search history.

(56) References Cited

U.S. PATENT DOCUMENTS

2022/0083846 A1* 3/2022 Berdan .................... G06N 3/04

* cited by examiner

*Primary Examiner* — Huan Hoang
(74) *Attorney, Agent, or Firm* — Maschoff Brennan

(57) ABSTRACT

Control circuits, memory systems, and operating methods are provided. A control circuit is configured to control operations of a memory array. The control circuit comprises an input circuit and a readout circuit. The input circuit is configured to: receive a plurality of input signals respectively driving a plurality of word lines of the memory array; select at least one first input signals having a first input value; and provide an activating voltage to at least one first word lines corresponding to the at least one first input signals in a first period. The readout circuit is coupled to a plurality of bit lines of the memory array, and configured to calculate a plurality of output sum signals according to the first input value.

20 Claims, 15 Drawing Sheets

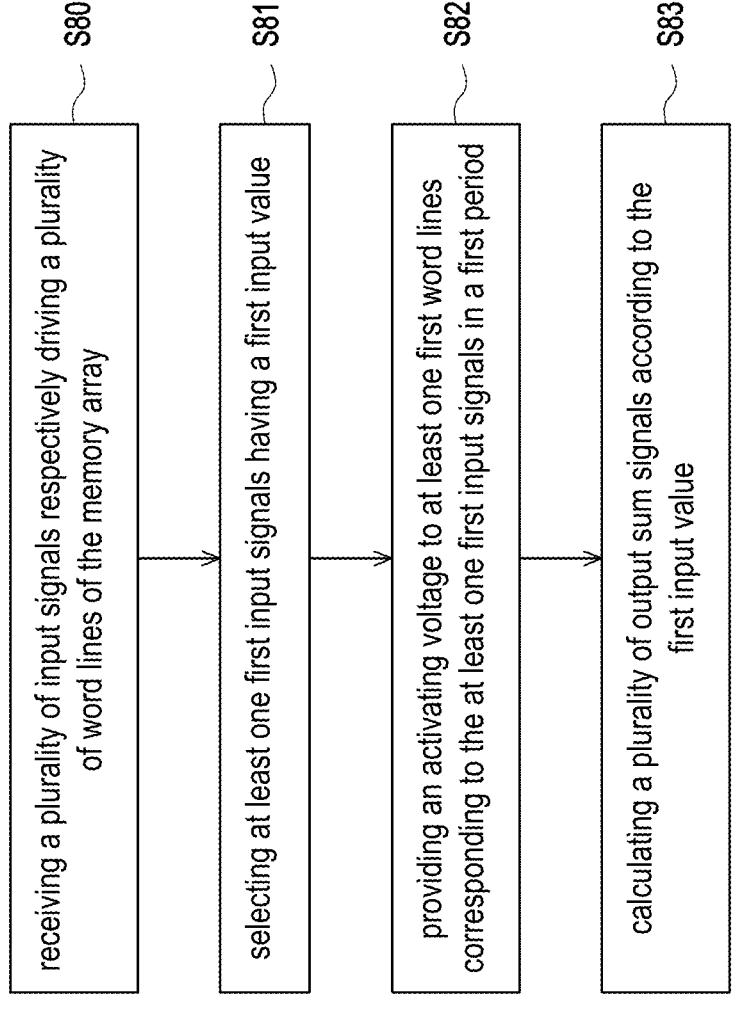

S80 receiving a plurality of input signals respectively driving a plurality of word lines of the memory array

S81 selecting at least one first input signals having a first input value

S82 providing an activating voltage to at least one first word lines corresponding to the at least one first input signals in a first period

S83 calculating a plurality of output sum signals according to the first input value

FIG. 8

CONTROL CIRCUIT, MEMORY SYSTEM, AND OPERATING METHOD

BACKGROUND

With the population of artificial intelligence, computing-in-memory (CiM) has attracted lots of attention due to its high speed performance while performing multiplication accumulation (MAC) operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 illustrates a flowchart of an operating method in accordance with some embodiments of the present disclosure.

DESCRIPTION OF THE EMBODIMENTS

Figure 1:
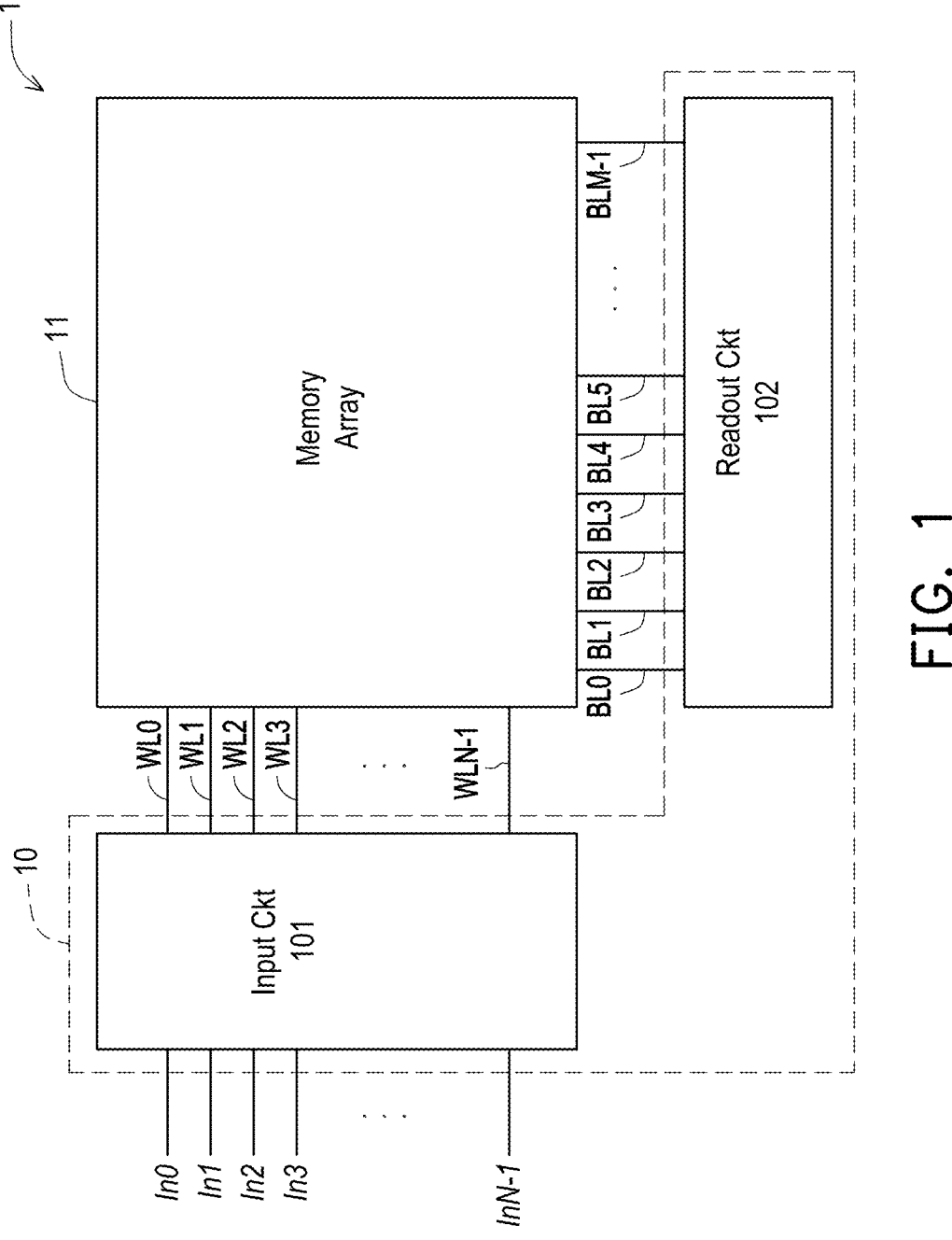
FIG. 1 illustrates a memory system in accordance with some embodiments of the present disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a memory system 1 in accordance with some embodiments of the present disclosure. The memory system 1 includes a control circuit 10 and a memory array 11. The input circuit 10 is configured to receive input signals In0 to InN−1 to perform a multiplication accumulation operation with weight values stored in the memory array 11.

In the exemplary configuration of FIG. 1, although it is not clearly illustrated, the memory array 11 comprises a plurality of memory cells arranged in columns and rows of the memory array 11. A memory cell may comprise an access transistor and at least one memory element. Electrical characteristics (e.g., resistance or threshold voltage) of each memory element can be programed in different levels. Therefore, the memory cell is capable of storing weight by programming electrical characteristics of the memory element into a corresponding level. In some embodiments, the memory cell in the memory array 11 is a multi-level cell (MLC), a tri-level cell (TLC) a quadra-level cell (QLC), or the like. In some embodiments, a memory system 1 comprising a plurality of described memory cells is configured as an MLC or TLC or QLC memory for storing weight.

In some embodiments, in each memory cell, the access transistor is serially connected to the at least one memory element. The access transistor may be controlled to be operated under conducted or cutoff, and thus the at least one memory element may be programmed and/or read out according to operations of the access transistor. In some embodiments, the memory cell may receive an input data to generate a corresponding computation result based on what level of the electrical characteristic of the memory element is programmed. Therefore, each memory cell may be programmed at a level corresponding to weight, and input data may be provided to the memory array 11 for performing a computing-in-memory (CiM) operation. In at least one embodiment, it is possible to achieve one or more advantages including, but not limited to, larger memory window, better computation performance, or the like.

The memory array 11 further comprises a plurality of word lines WL0 to WLN−1 extending along a row direction and a plurality of bit lines BL0 to BLM−1 extending along a column direction of the memory array 11. Each of the memory cells is disposed at an intersection of a corresponding word line and a corresponding bit line, and the memory cell is coupled to the corresponding bit line and the corresponding word line and further to the control circuit 10. The word lines are configured for transmitting addresses of memory cells, or memory elements in the memory cell, to be read from, and/or to be written to, or the like. The word lines are sometimes referred to as "address lines." The bit lines and/or the source lines are configured for transmitting data to be written to, and/or read from, the memory cells, or memory elements in the memory cell, indicated by the addresses on the corresponding word lines, or the like. The bit lines are and/or the source lines sometimes referred to as "data lines." Various numbers of word lines and/or bit lines and/or source lines in the memory array 11 are within the scope of various embodiments.

Examples of memory elements, which are programmable to have different electrical characteristic values, include, but are not limited to, non-volatile memories, such as resistive random-access memory (ReRAM or RRAM), magnetic RAM (MRAM), phase change memory (PCM), flash memory comprising charge storage material or floating gate, or the like. Both NOR and NAND gate flash memories are applicable to implement memory elements of the memory cell in one or more embodiments. An RRAM, MRAM or PCM memory cell comprises the access transistor electrically coupled in series with the memory element having a memory layer. The memory layer is programmable to have two or more states corresponding to two or more resistance values of the memory element. The gate of the access transistor of the RRAM, MRAM or PCM memory element corresponds to a control terminal of the memory element, and is electrically coupled to a corresponding word line. A flash memory element comprises a transistor having a floating gate or a charge storage layer. The floating gate or charge storage layer is programmable to store two or more level of charges corresponding to two or more resistance values of the memory element. The gate of the transistor of the flash memory element corresponds to a control terminal of the memory element, and is electrically coupled to a corresponding word line. Other types or configurations of memory elements are also within the scopes of various embodiments.

In some embodiments, a plurality of input signals are respectively provided to the plurality of word lines WL0 to WLN-1. The access transistors of the memory cells coupled to the same word line are turned on (conductive) or cutoff (non-conductive) by an input bit provided to the corresponding word line. The turned-on access transistor causes a current flowing through the memory cell as well as the memory element, which determines the level of the current flowing through based on the level of its electrical characteristic. In some aspect, the level of the current represents a product of the input bit multiplied by the weight. Then, the currents of the turned-on memory cells of each column are gathered on the corresponding bit line, so the level of the total current flowing through the bit line represents a summation of all products calculated by the memory cells on corresponding bit line. As a result, a multiplication accumulation (MAC) operation is performed by the memory array 11 by inputting the input signals to the word lines WL0 to WLN-1 and analyzing the level of the currents flowing on the bit lines BL0 to BLM-1.

The control circuit 10 includes an input circuit 101 and a readout circuit 102. The input circuit 101 is configured to receive a plurality of input signals In0 to InN-1 respectively driving the word lines WL0 to WLN-1 of the memory array 11; select at least one first word lines respectively driven by at least one first input signals having a first input value; and provide an activating voltage to the at least one first word lines to activate the at least one first word lines in a first period. The readout circuit 102 is coupled to the bit lines BL0 to BLM-1 of the memory array 11, and configured to calculate a plurality of output sum signals according to the first input value.

Specifically, each of the input signals In0 to InN-1 comprises a plurality of input bits. Instead of inputting each input bit to the corresponding word line bit by bit in respective periods, the input circuit 101 is configured to select the input signals having the same input value, and set the corresponding first word lines activated. By doing so, the first word lines, which were to be driven by the first input value represented by the input data with multiple bits, are changed to be driven by the first driving signal with only single bit. In each driving period, the driving signals with reduced single bit are provided to the word lines corresponding to the same input value for performing the MAC operation.

Further, the readout circuit 102 may be configured to receive currents corresponding to the MAC results as a plurality of first sum signals respectively from the bit lines BL0 to BLM-1. Since the MAC operation is performed by the memory array 11 using the driving signals with single bit, the first sum signals read from the bit lines BL0 to BLM-1 cannot reflect the actual value calculated by the corresponding input value, and thus proper calibration may be required to be performed on the received first sum signals. In order to obtain correct the MAC results, the input value corresponding to the driving signals may be utilized by the readout circuit 102 for restoration.

In brief, the control circuit 10 is configured to drive the word lines corresponding to the same input value in each period. In this way, the period corresponding to the input value of zero may be neglected since the corresponding MAC result is also zero, saving additional input cycles and power. For example, for the input signal with two bits of input data, the control circuit 10 only selects the input signals with 01, 10, 11 to drive the corresponding word lines in respective period. Further, since in each period, only the word lines corresponding to the same input value are driven, the driving signals of the word lines may be transformed from the multi-bit into single-bit, further reducing required periods for inputting data to the word lines WL0 to WLN-1.

Figure 2:
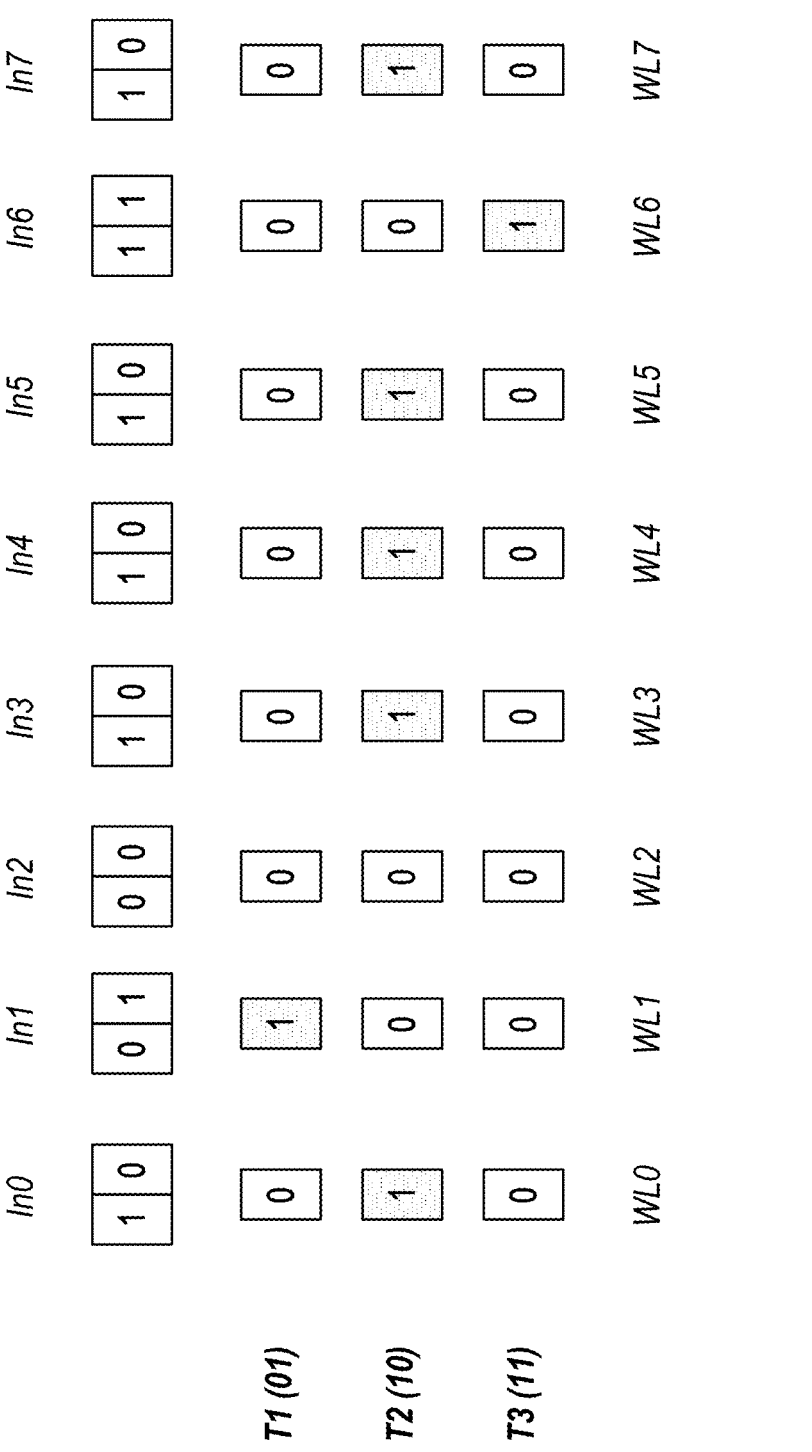
FIG. 2 illustrates a process of how driving signals are set and provided to the word lines according to input signals in accordance with some embodiments of the present disclosure.

FIG. 2 illustrates a process of how driving signals are set and provided to the word lines WL0 to WL7 according to input signals In0 to In7 in accordance with some embodiments of the present disclosure. In this embodiment, a row number N of the memory system 1 is set to 8 and input signals In0 to In7 are correspondingly inputted. In FIG. 2, the first row shows the input signals In0-In7 inputted to the control circuit 10, with each input signal consisting two bits of input data. Further, the second to fourth rows in FIG. 2 show the first to third driving signals generated by the input circuit 101 respectively in periods T1 to T3. Each input signal with two bits is transformed as the driving signal with single bit and inputted to the corresponding word line as labeled at the bottom in FIG. 2 by the input circuit 101.

In the first period T1, the input circuit 101 is configured to select the first input signal having the first input value 01. The input circuit 101 is configured to set the first driving signal corresponding to the first input signal In1 at an activating voltage (or at a logic high voltage) to driving the first word line WL1, while the driving signals corresponding to the remaining word lines WL0, WL2-WL7 are set to an inactivating voltage (or at a logic low voltage).

In the second period T2, the input circuit 101 is configured to select the second input signal having the second input value 10. As can be seen in FIG. 2, the input signals In0, In3, In4, In5, In7 have the input value 10, and thus the second driving signals for driving the second word lines WL0, WL3, WL4, WL5, WL7 are set at the activating voltage (or at the logic high voltage) by the input circuit 101, while the driving signals corresponding to the remaining word lines WL1, WL2, WL6 are set at the inactivating voltage (or at the logic low voltage).

In the third period T3, the input circuit 101 is configured to select the third input signal having the third input value 11. As can be seen in FIG. 2, only the input signal In6 has the input value 11, and thus the driving signal corresponding to the word line WL6 is set at the activating voltage (or at the logic high voltage) by the input circuit 101, while other driving signals are set at the inactivating voltage (or at the logic low voltage).

Figure 3A:
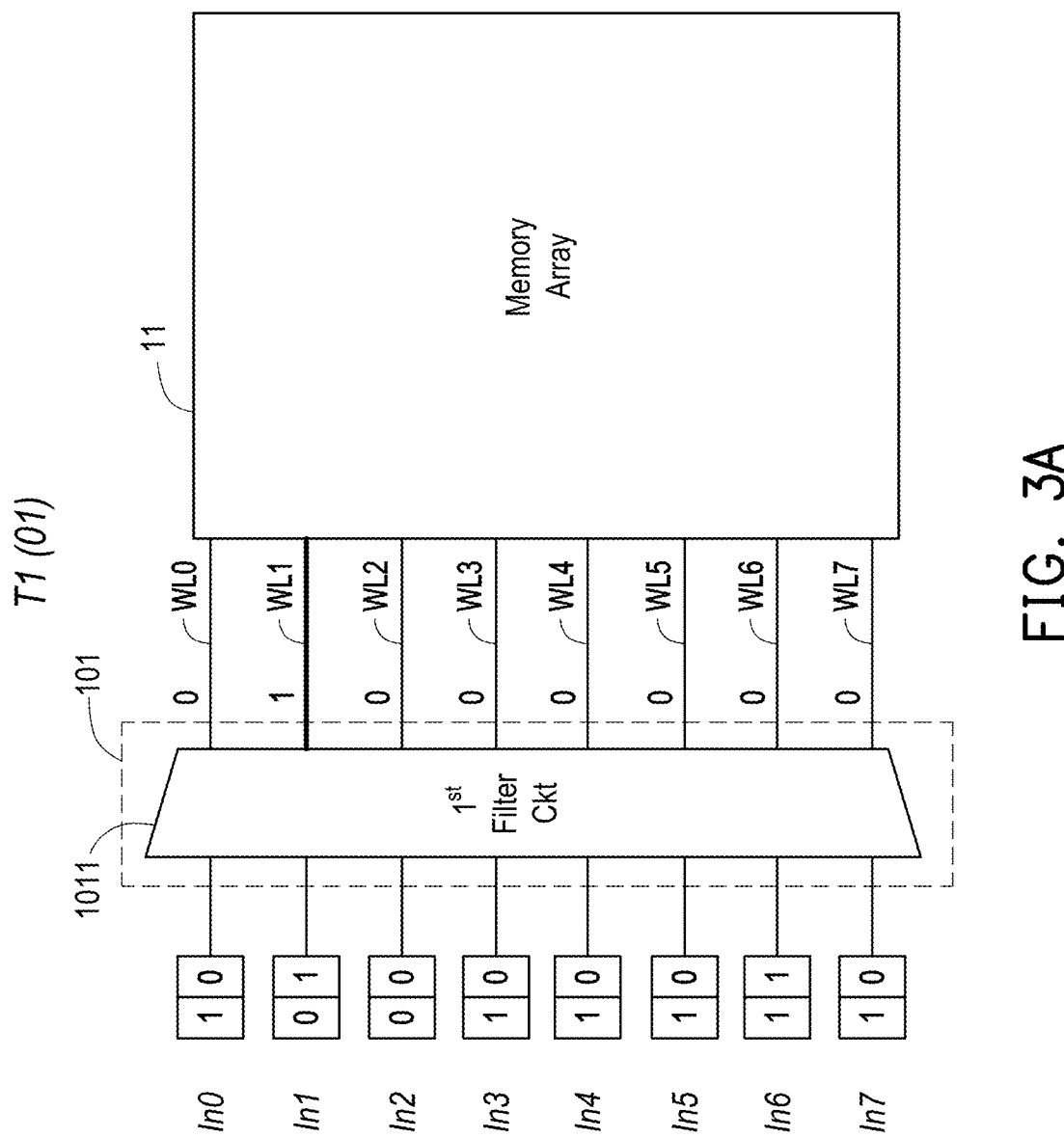
FIGS. 3A-3C illustrate operations of the input circuit driving the memory array using input signals in accordance with some embodiments of the present disclosure.
Figure 3B:
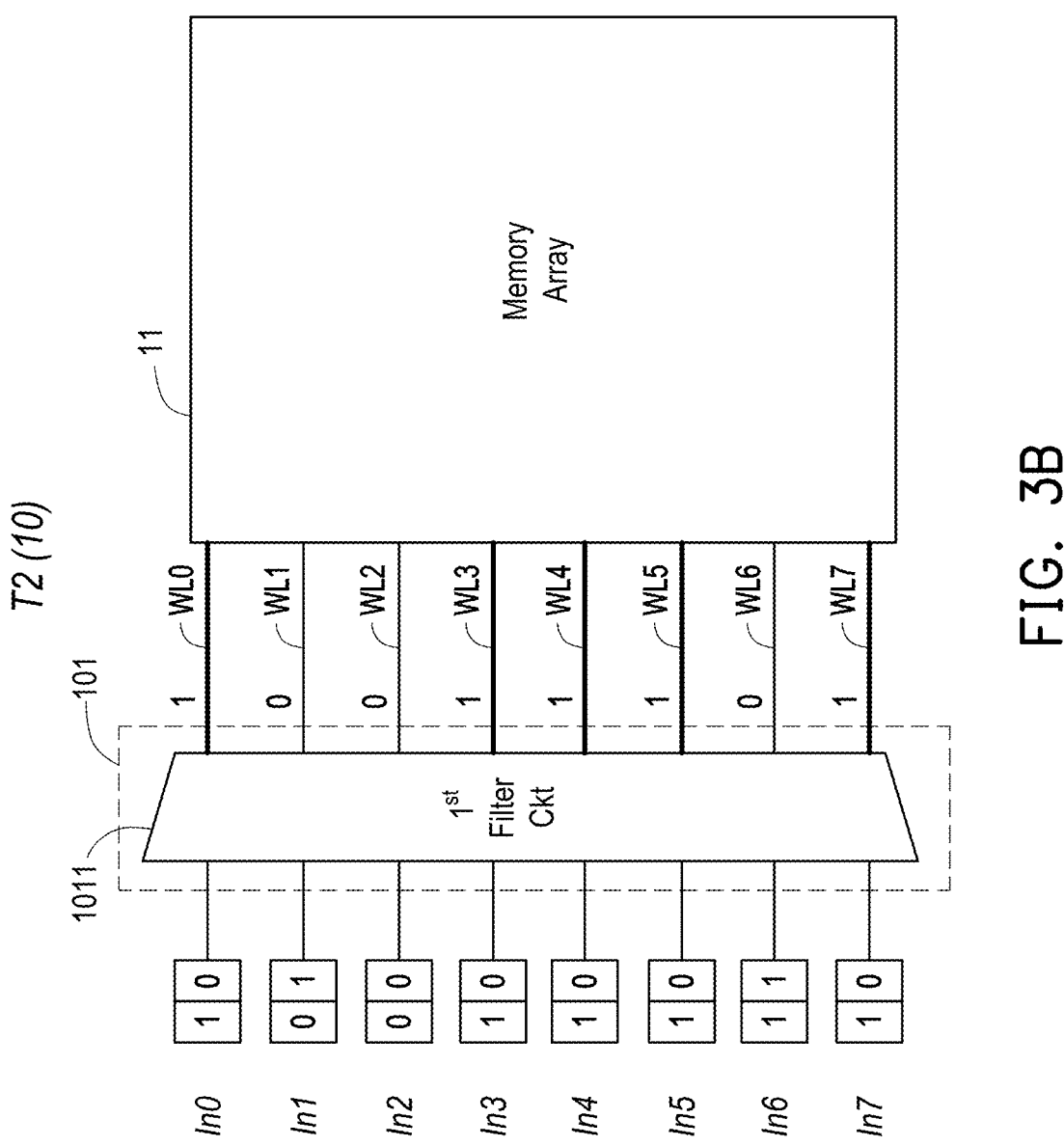
Figure 3C:
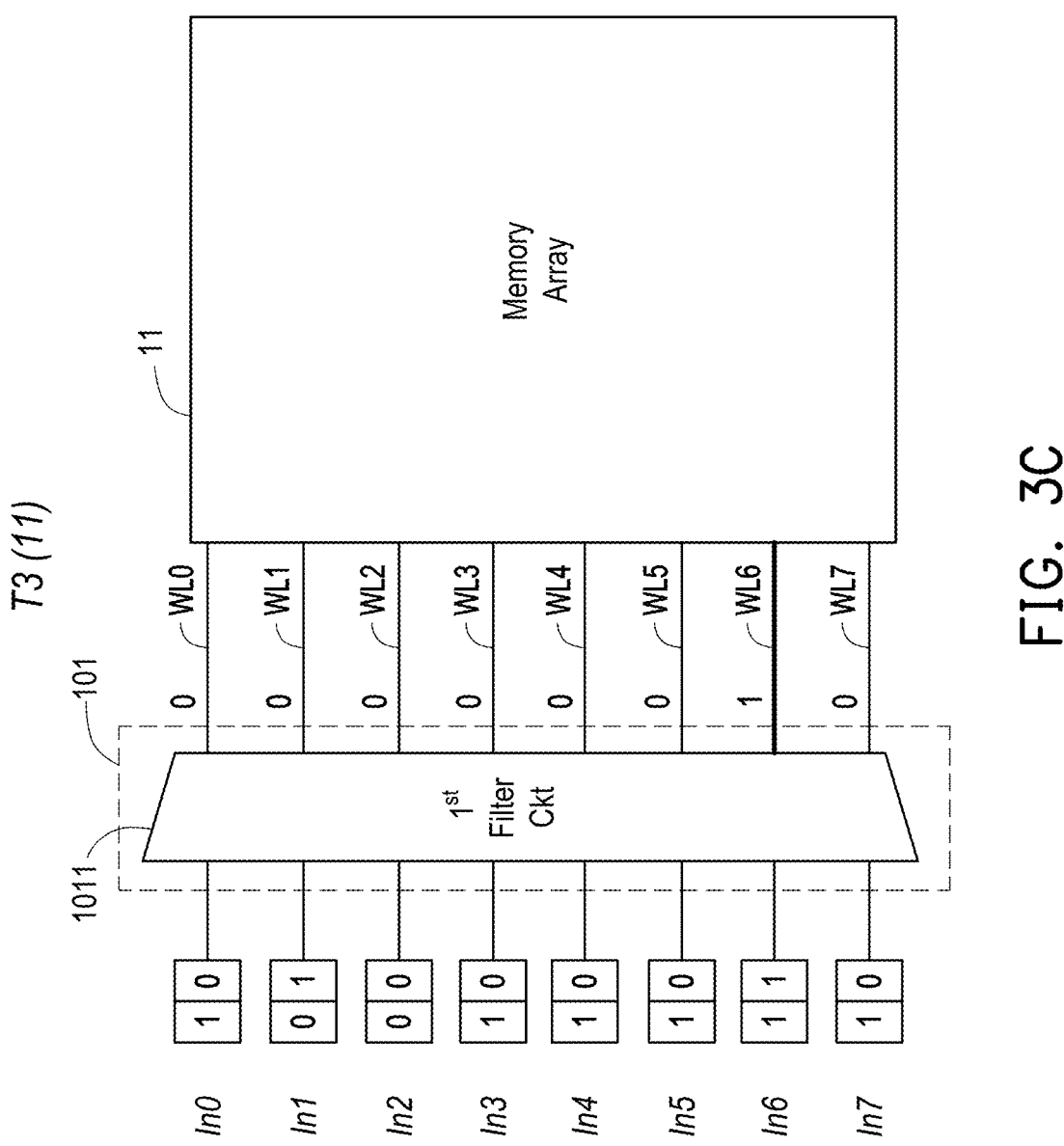

FIGS. 3A-3C illustrate operations of the input circuit 101 driving the memory array 11 using input signals In0 to In7 in accordance with some embodiments of the present disclosure. As shown in FIGS. 3A-3C, the input circuit 101 includes a first filter circuit 1011 configured to receive the input signals In0 to In7 to generate the driving signals. Following the embodiment as shown in FIG. 2, the first filter circuit 1011 is designed to receive input signals In0 to In7 each comprising two bits of input data and generate the driving signals each with merely one bit to activate or inactivate respective word lines WL0 to WL7 of the memory array 11. The first filter circuit 1011 may receive and transform the input signal with two bits as the corresponding driving signal with single bit, thereby reducing required input cycles.

FIG. 3A illustrates operations of the input circuit 101 driving the memory array 11 in the first period T1 in accordance with some embodiments of the present disclosure. In the first period T1, the first filter circuit 1011 is configured to drive the memory array 11 for performing the MAC operation with the first input value 01 inputted to the memory array 11. The first filter circuit 1011 is configured to pick out the first input signal In1 having the first input value 01 and set the first driving signal corresponding to the first word line WL1 at the activating voltage (labeled as 1 in FIG. 3A) while other first driving signals are set at the inactivating voltage (labeled as 0 in FIG. 3A).

FIG. 3B illustrates operations of the first filter circuit 1011 driving the memory array 11 in the second period T2 in accordance with some embodiments of the present disclosure. Specifically, in the second period T2, the first filter circuit 1011 is configured to drive the memory array 11 for performing the MAC operation with the second input value 10. The first filter circuit 1011 is configured to pick out the second input signals having the second input value 10, and set the second driving signals for driving the second word lines WL0, WL3, WL4, WL5, WL7 at the activating voltage (labeled as 1 in FIG. 3B), while other driving signals are set at the inactivating voltage (labeled as 0 in FIG. 3B).

FIG. 3C illustrates operations of the first filter circuit 1011 driving the memory array 11 in the third period T3 in accordance with some embodiments of the present disclosure. Specifically, in the third period T3, the first filter circuit 1011 is configured to drive the memory array 11 for performing the MAC operation with the third input value of 11. The first filter circuit 1011 is configured to pick out the third input signals having the third input value 11 and set the third driving signal corresponding to the input signal In6 at the activating voltage (labeled as 1 in FIG. 3C), while other third driving signals are set at the inactivating voltage (labeled as 0 in FIG. 3C).

Figure 4:
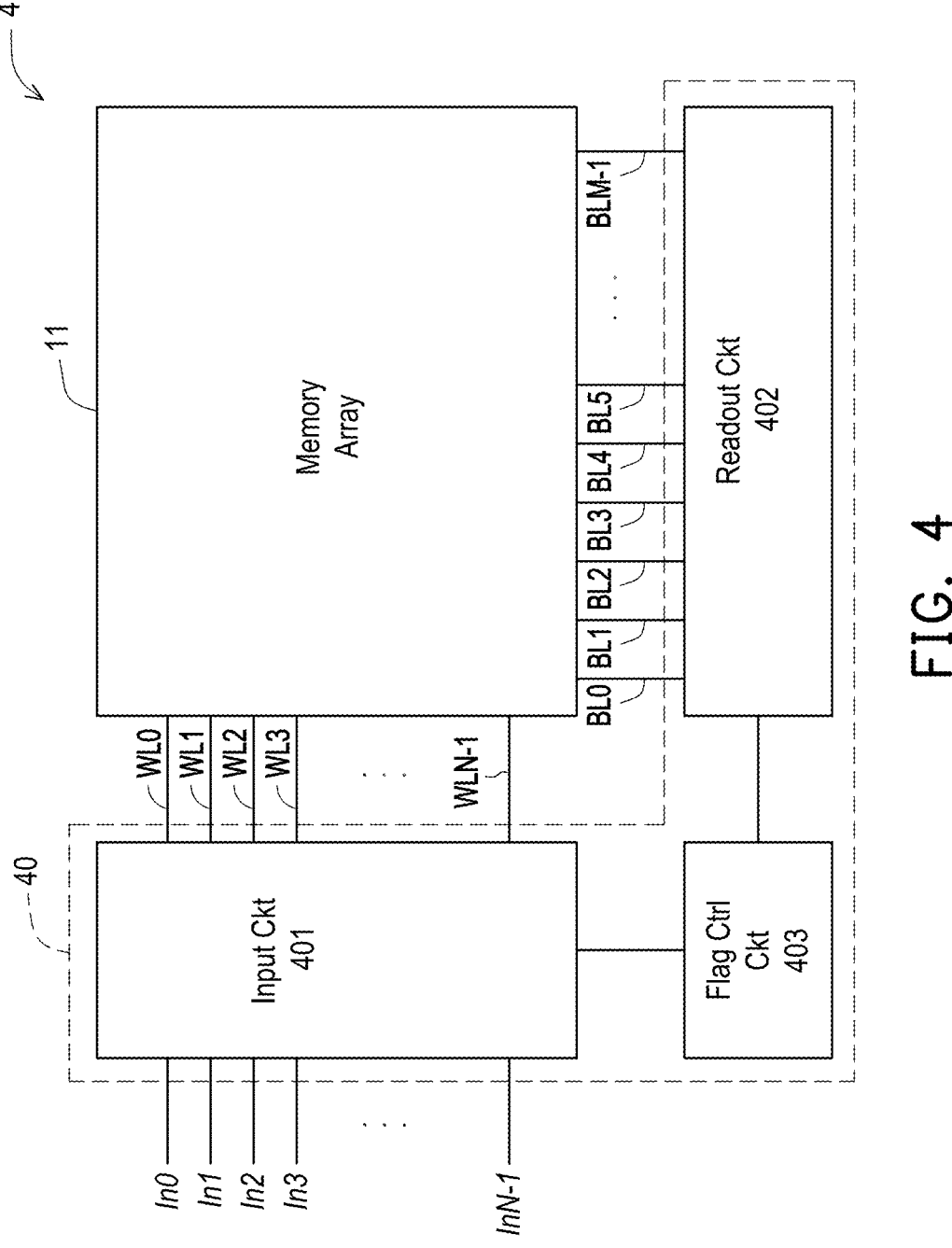
FIG. 4 illustrates a memory system in accordance with some embodiments of the present disclosure.

FIG. 4 illustrates a memory system 4 in accordance with some embodiments of the present disclosure. The memory system 4 includes a control circuit 40 and a memory array 11. Please refer to paragraphs above in relation to FIG. 1 for detailed structures and operations of the memory array 11, which is omitted herein. The control circuit 40 includes an input circuit 401, a readout circuit 402, and a flag control circuit 403. The input circuit 401 is configured to receive a plurality of input signals respectively driving a plurality of word lines WL0 to WLN−1 of the memory array 11; select at least one first input signals having a first input value; and provide an activating voltage to at least one first word lines corresponding to the at least one first input signals in a first period. The readout circuit 402 is coupled to the bit lines BL0 to BLM−1 of the memory array 11, and configured to calculate a plurality of output sum signals according to the first input value. The flag control circuit 403 is configured to provide a flag signal to the input circuit 401 and the readout circuit 402 for indicating the first input value.

Specifically, each input signals In0 to InN−1 consists of multiple input bits. Instead of inputting each input data to the corresponding word line bit by bit in each period, the input circuit 401 is configured to select at least one input signal having the same input value, and use the selected input signal each consisting of multiple bits to set a plurality of driving signals each consisting single bit to drive the word lines WL0 to WLM−1.

The readout circuit 402 may be configured to receive currents as first sum signals corresponding to the MAC results respectively from the bit lines BL0 to BLM−1. Since the MAC operation is performed by the memory array 11 using the driving signals with reduced single bit, the MAC results read from the bit lines BL0 to BLM−1 cannot reflect the actual values calculated by the input values. In order to obtain the correct MAC results, the readout circuit 402 may be configured to recover the MAC results using the input value of the selected input signals. Specifically, since the multiplier used in the MAC operation uses the bit value 1 to represent the corresponding input value, the correct MAC result may be restored by multiplying the received first sum signal by the corresponding input value.

In such embodiment, the control circuit 40 is configured to activate at most a predetermined number of word lines for performing the MAC operation. When a total number of the selected input signals is greater than the predetermined number, the input circuit 401 may dynamically adjusts activations of the corresponding word lines into multiple periods. Further, due to the dynamically adjusted cycle count of the multiple periods, a flag signal is utilized to record the current input value so that the readout circuit 402 may aware of the correct input value and generate the output sum signals using the flag signal.

Figure 5:
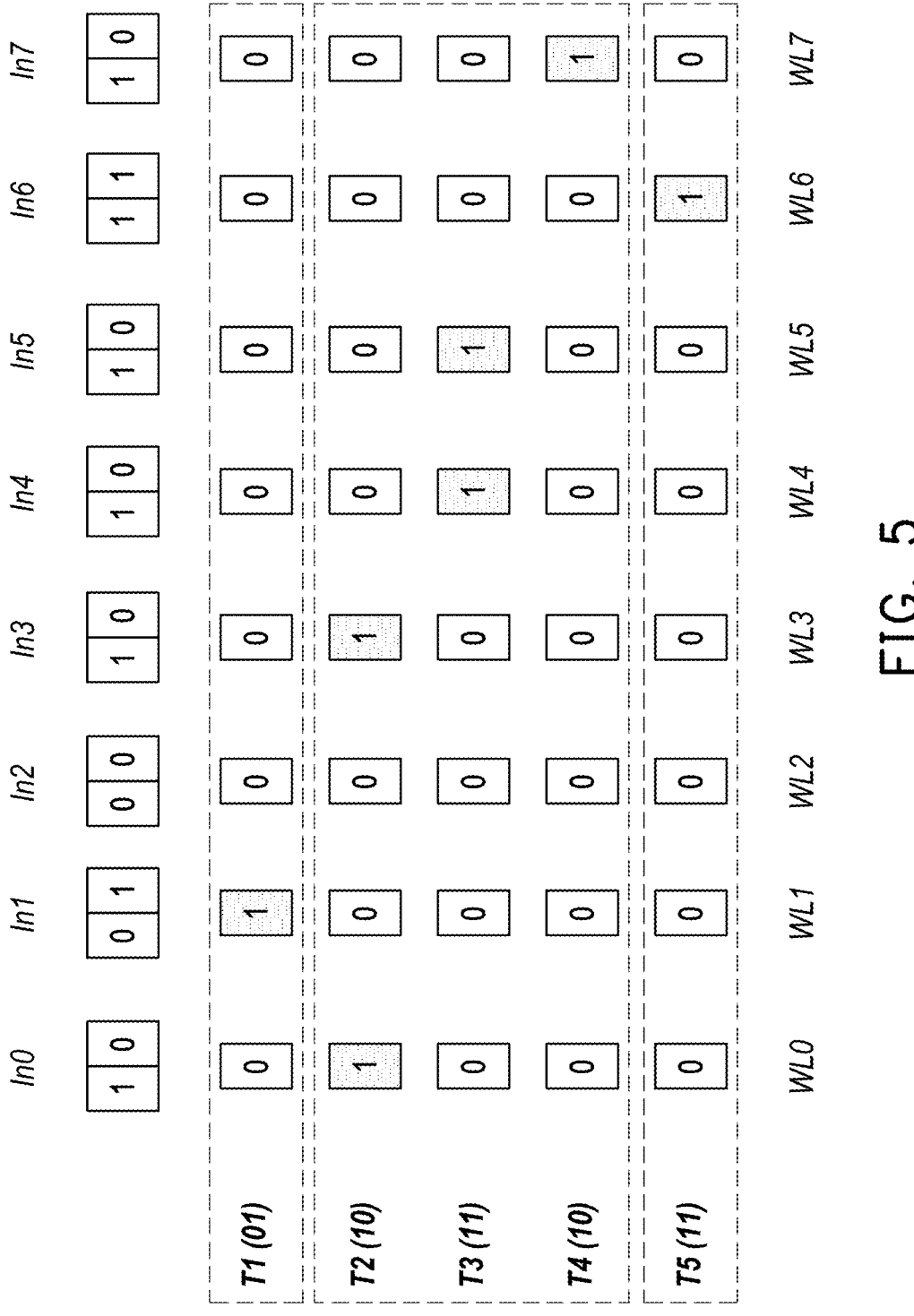
FIG. 5 illustrates a process of how driving signals are set and provided to word lines according to input signals in accordance with some embodiments of the present disclosure.

FIG. 5 illustrates a process of how driving signals are set and provided to word lines WL0 to WL7 according to input signals In0 to In7 in accordance with some embodiments of the present disclosure. In this embodiment, a row number N of the memory system 4 is set to 8 and input signals In0 to In7 are correspondingly inputted. In FIG. 5, the first row shows the input signals In0-In7 inputted to the control circuit 40, with each input signal consisting two bits of data. Further, the second to sixth rows in FIG. 5 show the driving signals generated by the input circuit 401 respectively in periods T1 to T5. Each input signal with two bits is transformed into the driving signal with single bit and inputted to the corresponding word line as labeled at the bottom in FIG. 5 by the input circuit 401.

In the first period T1, the input circuit 401 is configured to select the first input signal In1 having the first input value 01. The input circuit 401 is configured to generate the first driving signal at the activating voltage (or at the logic high voltage) to drive the first word line WL1 corresponding to the input signal In1, while other first driving signals corresponding to the remaining word lines WL0, WL2-WL7 are set at the inactivating voltage (or at the logic low voltage).

In the second periods T2-T4, the input circuit 101 is configured to select the second input signal In0, In3, In4, In5, In7 having the second input value 10. In this embodiment, the control circuit 40 is configured to activate at most two second word lines in each period, and thus the control circuit 40 is configured to divide the second input signals In0, In3, In4, In5, In7 into three groups, with each group corresponds to two second input signals at most.

Specifically, in the second period T2, the first input signals In0, In3 are selected by the input circuit 401, and the first group of second driving signals corresponding to the second word lines WL0, WL3 are set at the activating voltage (or at the logic high voltage) by the input circuit 401. In the second period T3, the input signals In4, In5 are selected and the second group of second driving signals corresponding to the second word lines WL0, WL3 are set at the activating voltage (or at the logic high voltage) by the input circuit 401. In the second period T4, the input signal In7 is selected and the third group of second driving signal corresponding to the second word line WL7 is set at the activating voltage (or at the logic high voltage) by the input circuit 401.

At last, in the third period T5, the input circuit 401 is configured to select the third input signal In6 having the third input value 11. The input circuit 401 is configured to set the third driving signal at the activating voltage (or the logic high voltage) to drive the corresponding third word line WL6.

FIGS. 6A-6E illustrate operations of the input circuit 401 driving the memory array 11 using input signals In0 to In7 in accordance with some embodiments of the present disclosure. As shown in FIGS. 6A-6E, the input circuit 401 includes a first filter circuit 4011 and a second filter circuit 4012. Following the embodiment as shown in FIG. 5, the input circuit 401 is configured to drive at most two word lines in each period. The first filter circuit 4011 is configured to receive the input signals In0 to In7 and select at least one first input signals having the same input value, and set a first filter signal corresponding to the first input signals at the activating voltage to activate the corresponding word lines. The second filter circuit 4012 is configured to receive the first filter signals; divide the first filter signals into a plurality of groups of second filter signals when a total number of the first driving signals is greater than a predetermined number; and provide the plurality groups of second filter signals as driving signals to the corresponding word lines respectively in a plurality of second periods.

In some aspect, in each period, the first filter circuit 4011 may select all input signals corresponding to the same input value and output the first filter signals with merely single bit to drive those word lines correspond to the same input value. Then, in order to drive limited amount of word lines in each period, the second filter circuit 4012 may be utilized to divide the activated first filter signals into the plurality groups of second filter signals, so each group of the second filter signals may consist of at most two activated second filter signals.

Figure 6A:
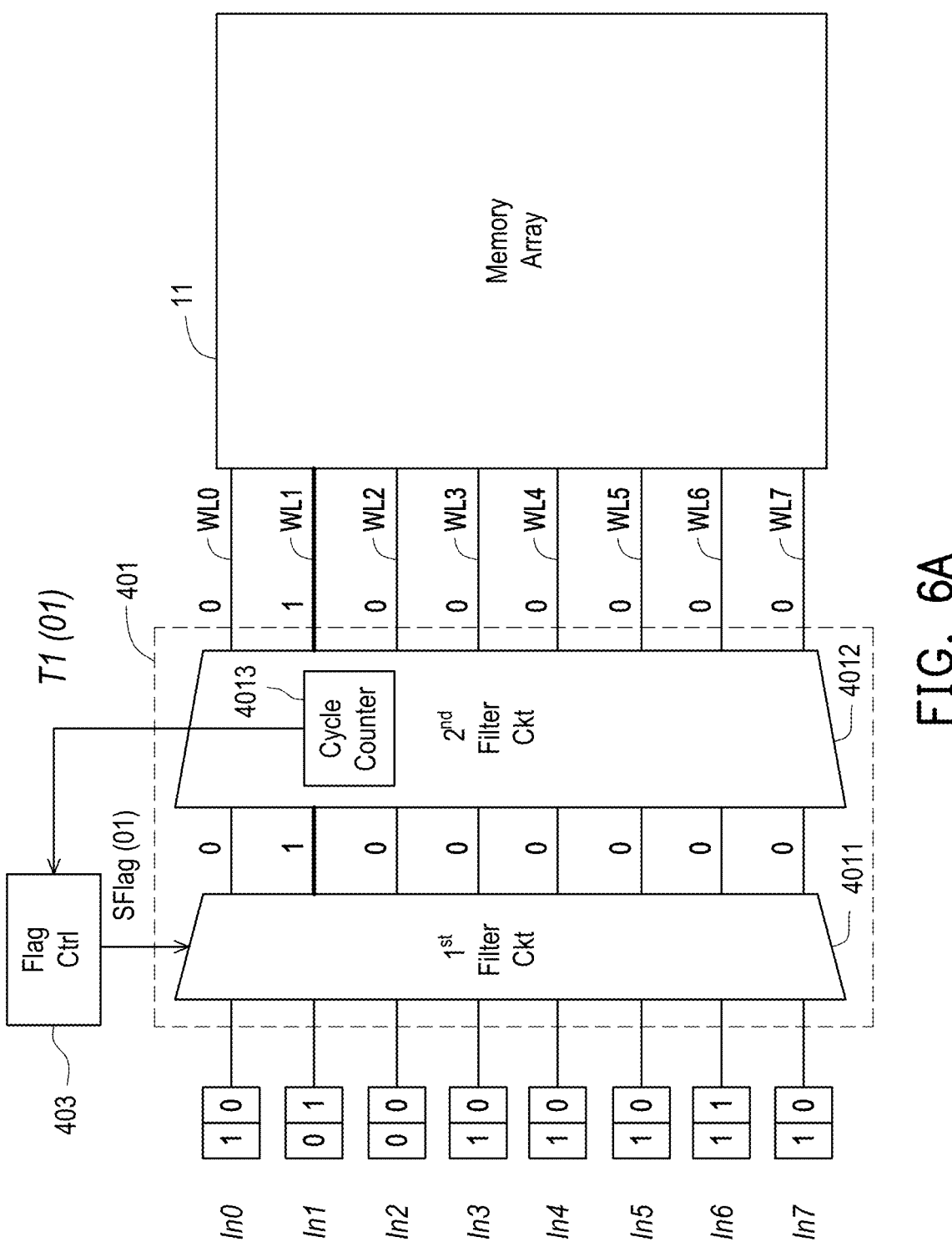
FIGS. 6A-6E illustrate operations of the input circuit driving the memory array using input signals in accordance with some embodiments of the present disclosure.

FIG. 6A illustrates operations of the input circuit 401 driving the memory array 11 in the first period T1 in accordance with some embodiments of the present disclosure. In the period T1, the flag control circuit 403 may be configured to generate a flag signal SFlag corresponding to the first input value 01, so the first filter circuit 4011 may be aware of which are the first input signals In1 having the input value 01 and should be selected, and the first filter signal corresponding to the first input signal In1 may be accordingly set at the activating voltage (or at the logic high voltage). Further, the second filter circuit 4012 is configured to output the second filter signal set at the activating voltage (or the logic high voltage) and use the second filter signal as the first driving signal to drive the word line WL1.

Figure 6B:
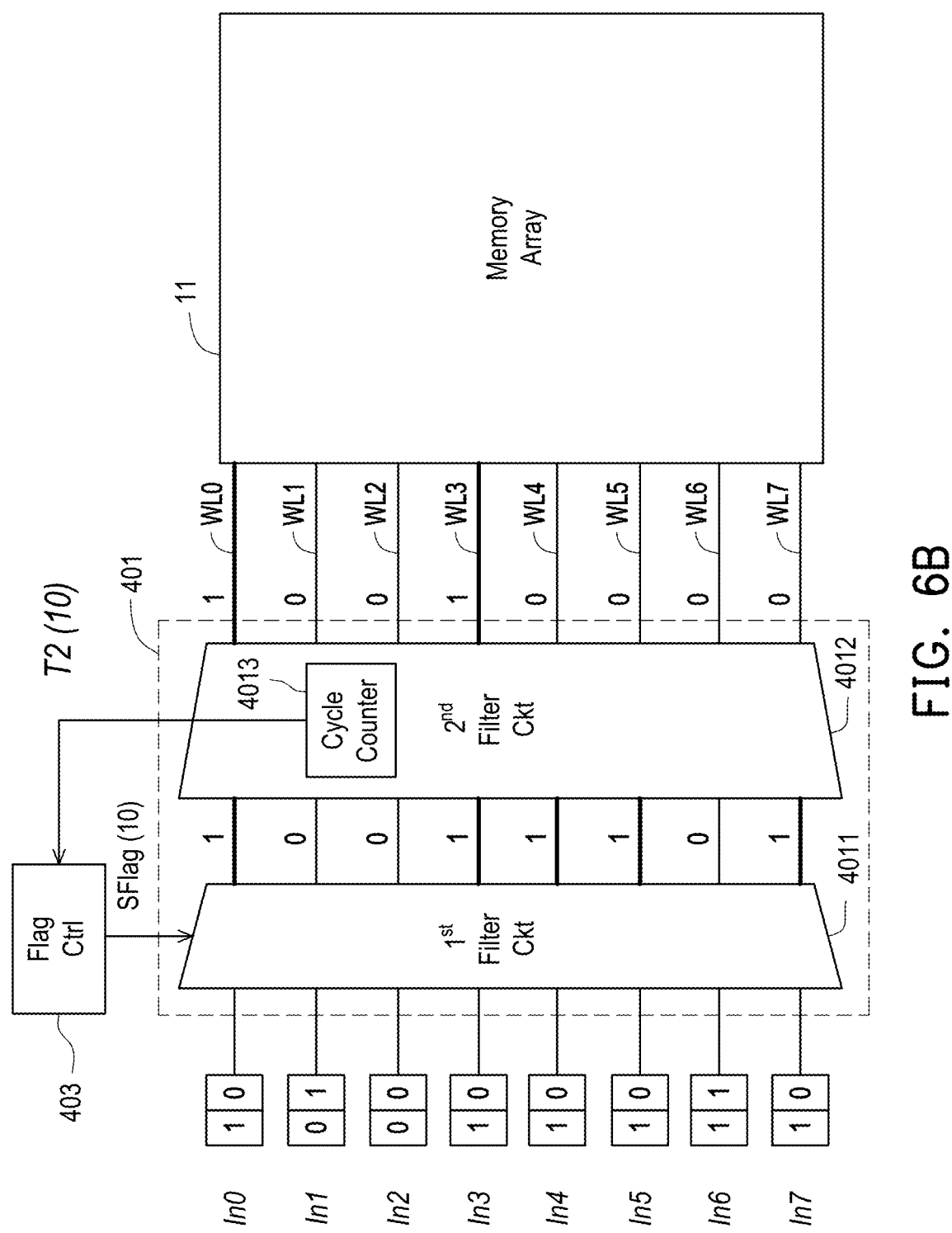
Figure 6C:
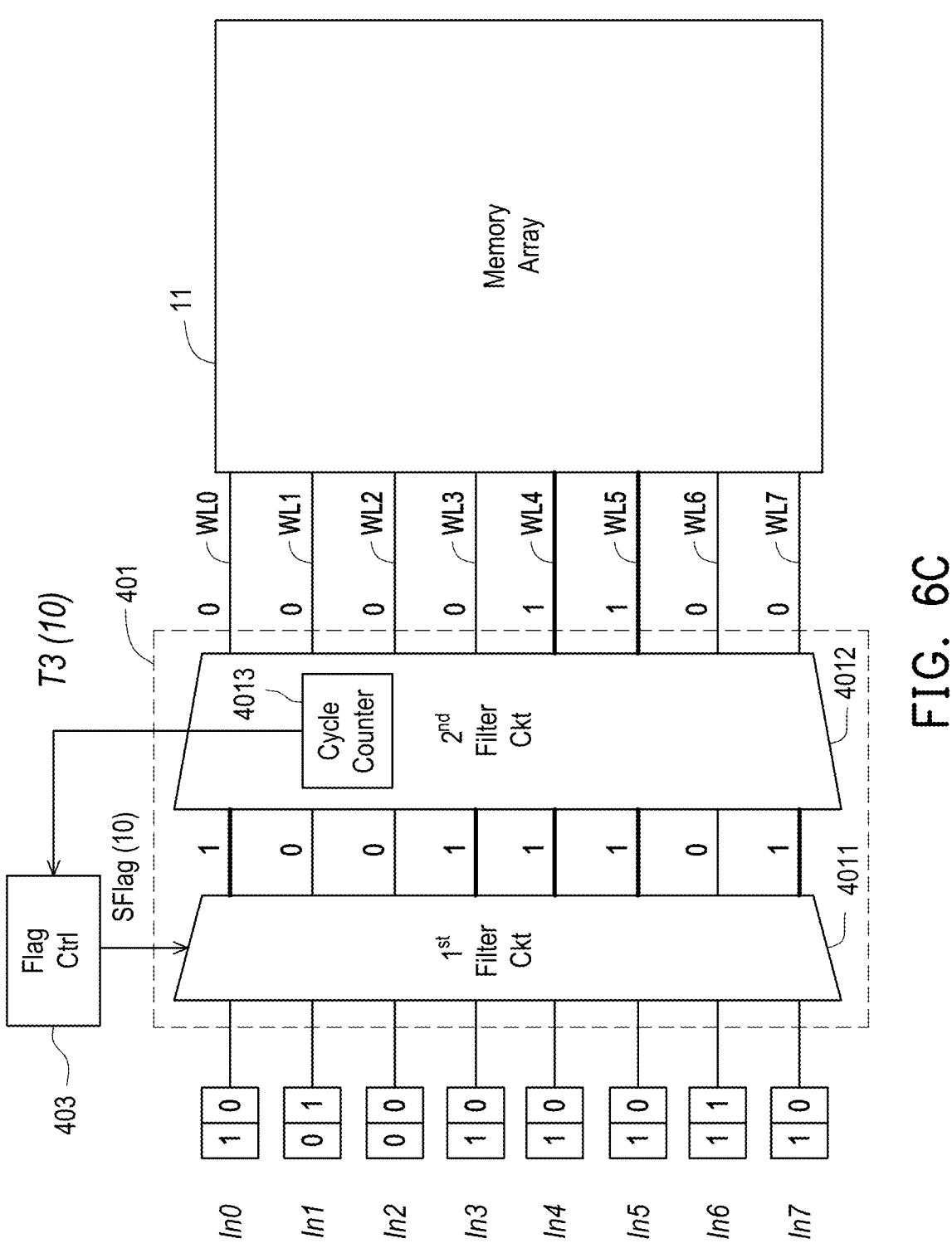
Figure 6D:
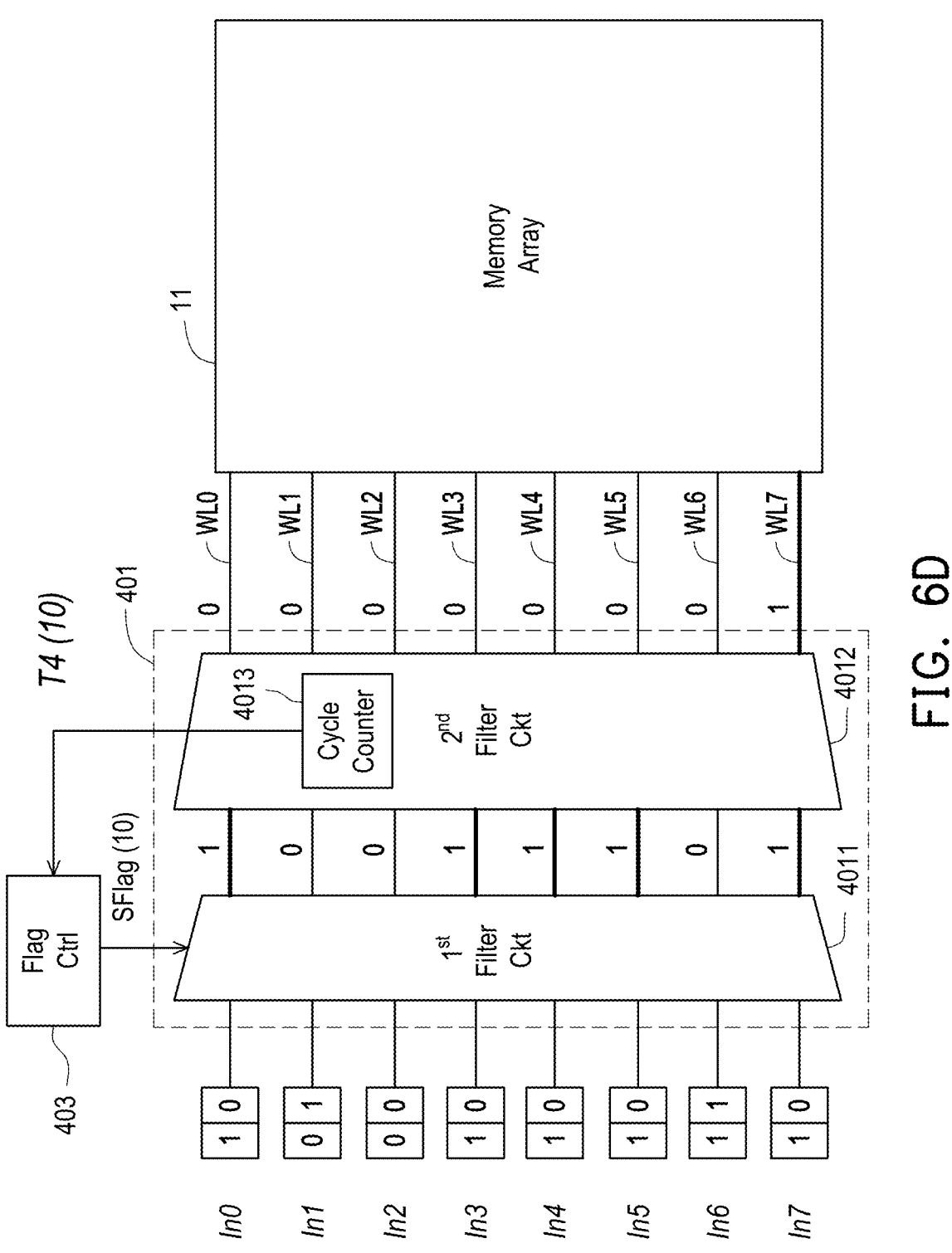

FIGS. 6B-6D illustrate operations of the input circuit 401 driving the memory array 11 in the second periods T2-T4 in accordance with some embodiments of the present disclosure. Specifically, in the second period T2 illustrated in FIG. 6B, the flag control circuit 403 may be configured to generate the flag signal SFlag corresponding to the second input value 10, so the first filter circuit 4011 is configured to select all the second input signals In0, In3, In4, In5, In7 having the second input value of 10. The first filter circuit 4011 is configured to set the first filter signals corresponding to all of the second input signals In0, In3, In4, In5, In7 at the activating voltage (or at the logic high voltage). Further, the second filter circuit 4012 is configured to divide the activated first filter signals into multiple groups of second filter signals, with each group consisting at most two activating second filter signals. In the second period T2, the second filter circuit 4012 is configured to output the second filter signals corresponding to the second input signals In0, In3 at the activating voltage (or at the logic high voltage) as the second group of second driving signals, to drive the word lines WL0, WL3.

In the second period T3 illustrated in FIG. 6C, the first filter circuit 4011 is configured to maintain activating the first filter signals corresponding to the second input value. However, the second filter circuit 4012 turned to select the second group of second filter signals corresponding to the second input signals In4, In5. The second filter circuit 4012 is configured to output the second filter signals corresponding to the input signals In4, In5 at the activating voltage (or the logic high voltage) as the second group of second driving signals, to drive the word lines WL4, WL5.

In the second period T4 illustrated in FIG. 6D, the second filter circuit 4012 turned to output the second filter signal corresponding to the input signal In7 at the activating voltage (or at the logic high voltage) as the third group of second driving signal, to drive the word line WL7.

Figure 6E:
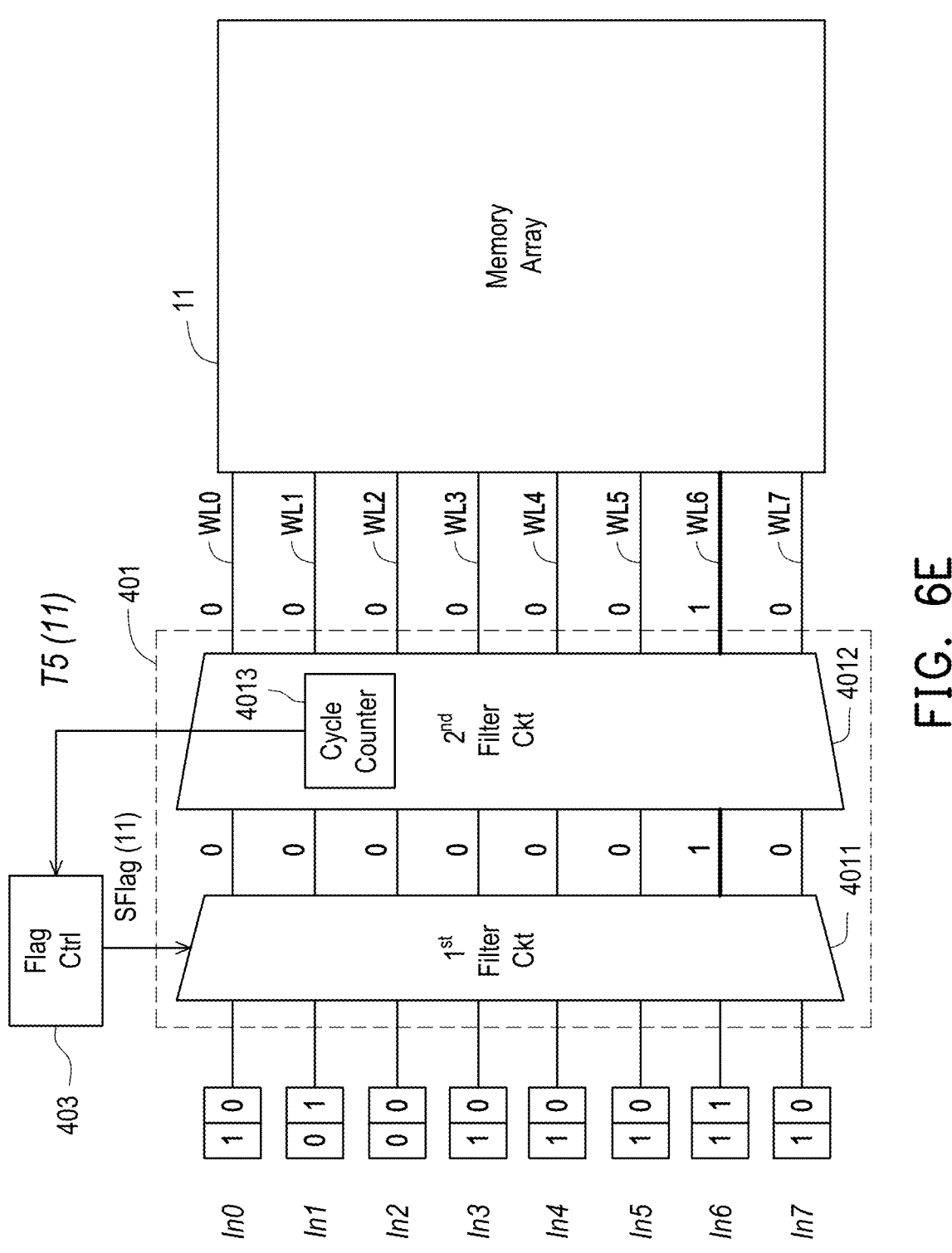

FIG. 6E illustrates operations of the input circuit 401 driving the memory array 11 in the third period T5 in accordance with some embodiments of the present disclosure. In the third period T5, the flag control circuit 403 may be configured to generate the flag signal SFlag corresponding to the third input value 11, so the first filter circuit 4011 may be configured to pick out the third input signal In6 having the input value 11 and set the first filter signal corresponding at the third input signal In6 at the activating voltage (or at the logic high voltage). Further, the second filter circuit 4012 is configured to provide the second filter signal at the activating voltage (or the logic high voltage) as the third driving signal to the third word line WL6, and provide the second filter signals at the inactivating voltage (or the logic low voltage) to other word lines WL0-WL5, WL7.

Particularly, the input circuit 401 is configured to dynamically adjust a total cycle count corresponding to each input value. In order to do so, a cycle counter 4013 is disposed inside the second filter circuit 4012 for implementing such function. The cycle counter 4013 is configured to calculate the total cycle count by dividing the total number of the activated first filter signals by the predetermined number, record a cycle count of how groups of the second driving signals are provided to the corresponding word lines; and provide a finishing signal to the flag control circuit 403 when the recorded cycle count reaches the total cycle count. In other words, the cycle counter 4013 is capable dividing the total number of first filter signals into multiple groups with each group consisting at most the predetermined number of second filter signals. Further, the cycle counter 4013 also records how many groups of second filter signals are provided to the memory array 11. After the recorded cycle count reaches the total cycle count, the cycle counter 4013 may accordingly output the finishing signal to the flag control circuit 403, informing the flag control circuit 403 that all word lines corresponding to the selected input value have been activated for performing the CiM operation, so that the flag control circuit 403 may switch the flag signal SFlag to the next input value.

Figure 7A:
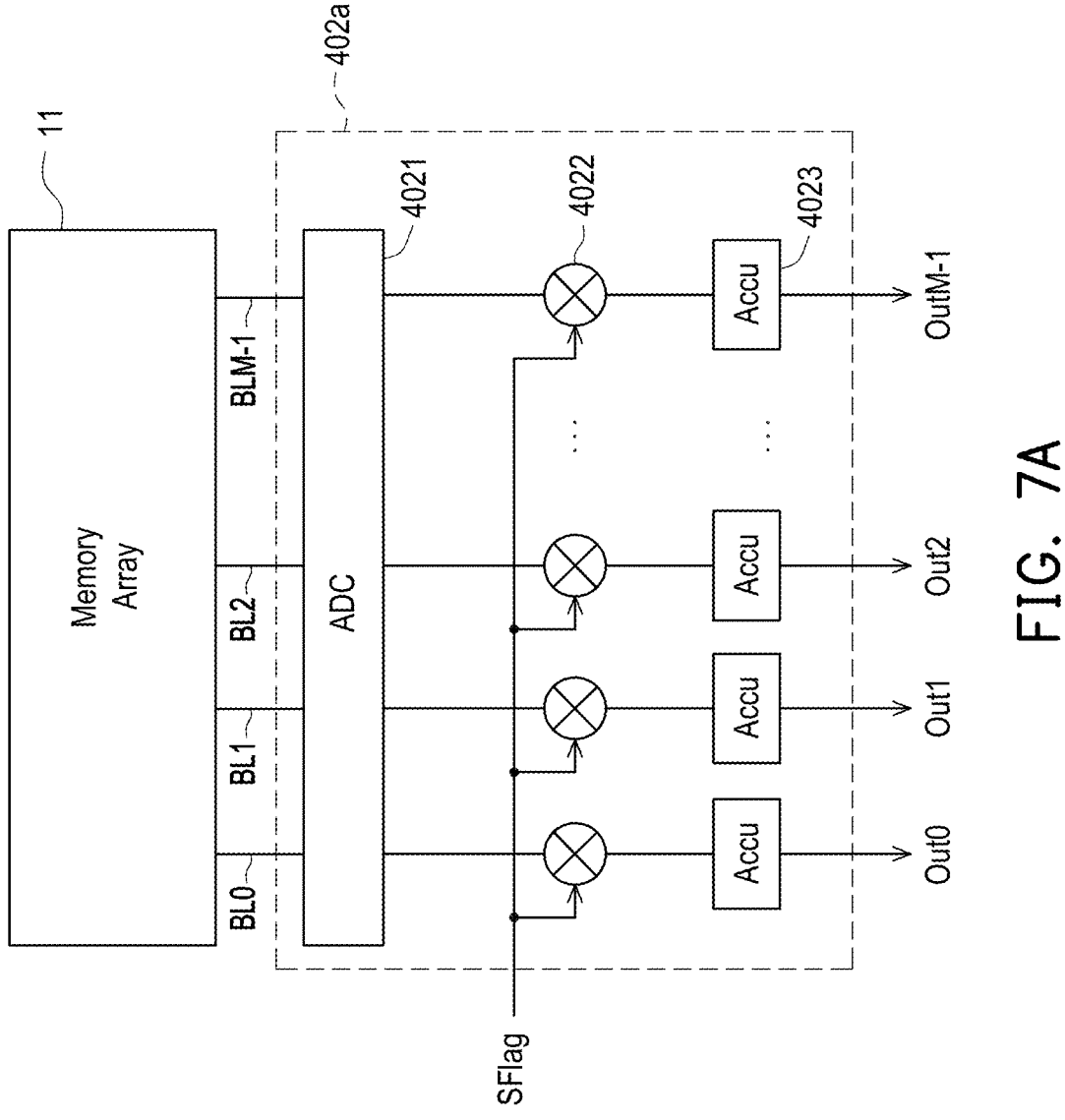
FIG. 7A illustrates a schematic diagram of a readout circuit in FIG. 4 in accordance with some embodiments of the present disclosure.

FIG. 7A illustrates a schematic diagram of a readout circuit 402a in FIG. 4 in accordance with some embodiments of the present disclosure. The readout circuit 402a may be utilized to calculate the output sum signals (i.e., the MAC results) using the corresponding first input value. Specifically, the readout circuit 402a includes an analog-to-digital converter (ADC) 4021, a plurality of configurable multipliers 4022, and a plurality of accumulators 4023. The ADC 4021 is coupled to bit lines BL0 to BLM−1 of the memory array 11 and configured to receive a plurality of first sum signals received through evaluating levels of electrical characteristics (e.g., voltage, current, capacitance, resistance, etc.) measured on the bit lines BL0 to BLM−1. The ADC 4021 is configured to convert the first sum signals from analog to digital. The configurable multipliers 4022 are coupled to the ADC 4021 and configured to receive the digital first sum signals and recover them into a plurality of second sum signals using the flag signal SFlag. Specifically, the configurable adders 4022 are configured to receive the first sum signals from the plurality of bit lines BL0 to BLM−1; and multiply the plurality of first sum signals by the first input value as indicated by the flag signal SFlag to generate a plurality of second sum signals. Since each first sum signal is calculated using the digital value 1 representing the first input value as the multiplier instead of the original first input value during the MAC operation, the calculated first sum signal is deviated and requires calibration. In order to obtain the correct MAC result, the configurable adder 4022 is configured to multiply each first sum signal by the first input value, and output the multiplication result as the second sum signal. Then, since there are multiple input values, a plurality of accumulators 4023 are respectively coupled to the configurable adders 4022 and configured to accumulate the second sum signals of different input values to generate a plurality of output sum signals Out0 to OutM−1.

Taking FIG. 5 as an example, each input signal consists of a two-bit input data, so there are three possible input values 01, 10, 11 with 00 neglected. The configurable adder 4022 is capable of performing the multiplication with the 1, 2, or 3 as the multiplier according to the flag signal SFlag. Further, in this embodiment, assuming each weight value is stored in a corresponding memory cell, each calculated first sum signal corresponds to the complete MAC result calculated using the weight values with a corresponding input value.

Specifically, in the first period T1 illustrated in FIG. 5, the configurable adder 4022 is configured to receive the corresponding first sum signal and pass the value of the first sum signal as the second sum signal since the first input value in the period T1 is 1. In the second periods T2-T4, each configurable adder 4022 is configured to multiply the first sum signal by the corresponding second input value 2. In the third period T5, each configurable adder 4022 is configured to multiply the first sum signal by the corresponding third input value 3. At the end, the accumulator is configured to accumulate all of the second sum signals calculated throughout the first to third periods T1-T5 to calculate output sum signal corresponding to the complete MAC result calculated using the weights and inputs.

Figure 7B:
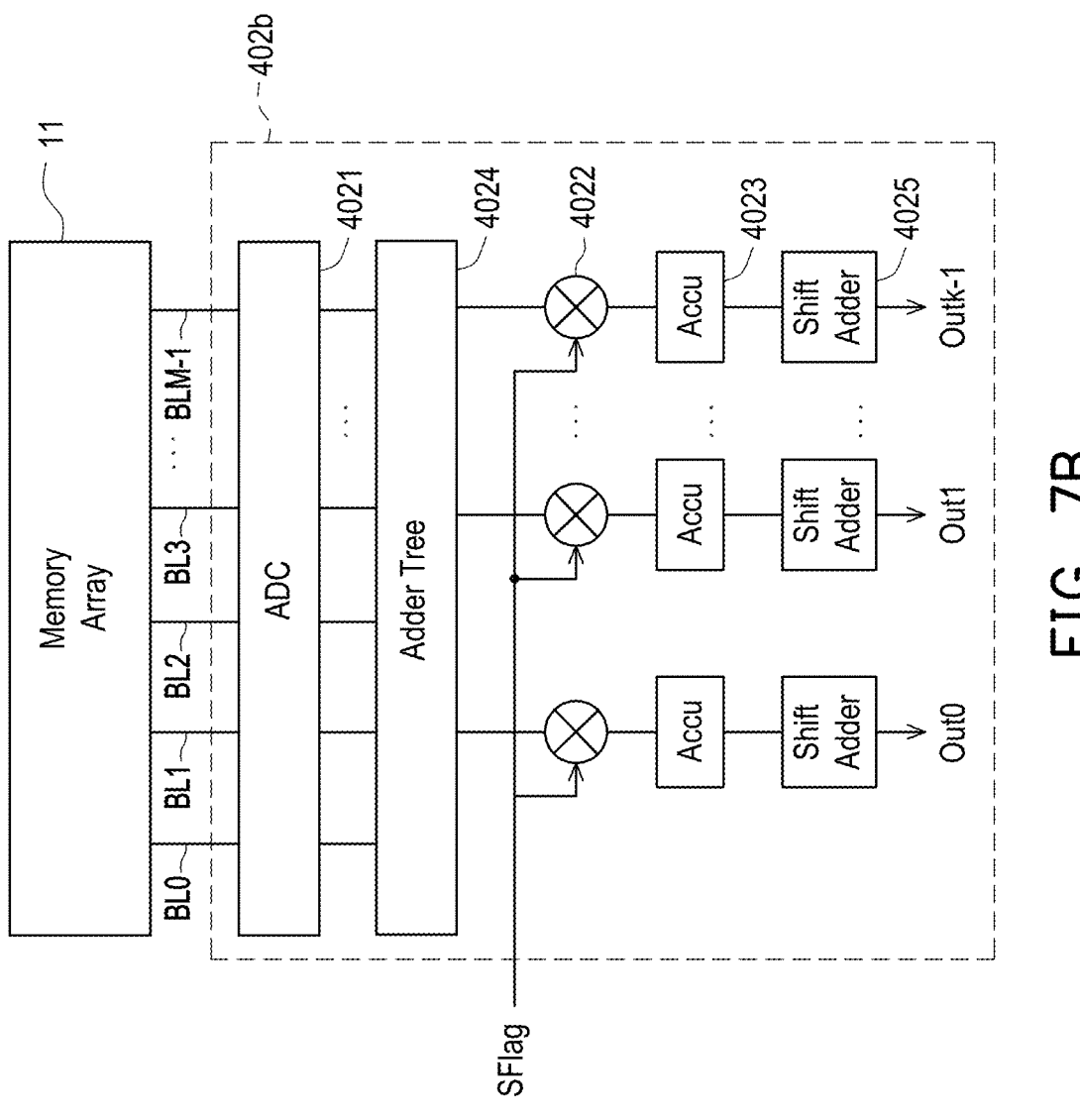
FIG. 7B illustrates a schematic diagram of a readout circuit in FIG. 4 in accordance with some embodiments of the present disclosure.

FIG. 7B illustrates a schematic diagram of a readout circuit 402b in FIG. 4 in accordance with some embodiments of the present disclosure. The readout circuit 402b in FIG. 7B is similar to the readout circuit 402a in FIG. 7A except an adder tree 4024 and a plurality of shift adders 4025 are disposed in the readout circuit 402b, so please refer to paragraphs above for detailed operations related to the ADC 4021, the configurable adder 4022, and the accumulator 4023, which are omitted herein.

Specifically, the adder tree 4024 is for calculating placing value of the weights, and the shift adders 4025 are for calculating place value of the inputs. For example, when each weight value is divided and stored by two memory cells, the adder tree 4024 is configured to collect partial sum signals received from the corresponding two bit lines and sum them up according to their corresponding bit values to restore the partial sum signals as the complete first sum signal. Besides, when each input value is represented by eight bits of input data, each input value may be divided into four input signals each consisting two bits of data and inputted to the memory system 4. In this way, after the accumulators 4023 generate the MAC results calculated by the weight values and the two bits of the input values, the shift adder 4025 is configured to shift and accumulate the MAC results calculated using the divided input value and restore them as an output sum signal Out0 to OutK−1 corresponding to the complete MAC result calculated using the weights and the input values.

In some embodiments, each of the readout circuits 402a, 402b may also be applied to replace the readout circuit 102 illustrated in FIG. 1, except that the flag signal SFlag may be read from a memory or a processor indicating a predetermined sequence of the first input value selected by the control circuit 10. In some embodiments, each input signal may comprise more than two bits.

FIG. 8 illustrates a flowchart of an operating method in accordance with some embodiments of the present disclosure. The operating method in FIG. 8 may be utilized for controlling the memory system 1 in FIG. 1 or the memory system 4 in FIG. 4. The paragraphs in above describing operations of the memory system 1 or the memory system 4 may be summarized as the operating method in FIG. 8, so please refer to related paragraphs above for greater details, which are omitted herein. The operating method includes steps S80-S83.

In step S80, a plurality of input signals respectively for driving a plurality of word lines of the memory array are received by the input circuit. In step S81, at least one first input signals having a first input value are selected by the input circuit. In step S82, an activating voltage is provided by the input to at least one first word lines corresponding to the at least one first input signals in a first period. In step S83, a plurality of output sum signals are calculated by a readout circuit according to the first input value.

In some embodiments, a control circuit is configured to control operations of a memory array. The control circuit comprises an input circuit and a readout circuit. The input circuit is configured to: receive a plurality of input signals respectively driving a plurality of word lines of the memory array; select at least one first input signals having a first input value; and provide an activating voltage to at least one first word lines corresponding to the at least one first input signals in a first period. The readout circuit is coupled to a plurality of bit lines of the memory array, and configured to calculate a plurality of output sum signals according to the first input value.

In some embodiment, an operating method of a memory system comprises: receiving a plurality of input signals respectively driving a plurality of word lines of a memory array of the memory system; selecting at least one first input signals having a first input value; and providing an activating voltage to at least one first word lines corresponding to the at least one first input signals in a first period; and calculating a plurality of output sum signals according to the first input value.

In some embodiments, a memory system comprises a memory array and a control circuit. The memory array comprises a plurality of memory cells, a plurality of word lines, and a plurality of bit lines. Each memory cell is coupled to the corresponding word line and the corresponding bit line. The control circuit comprises an input circuit and a readout circuit. The input circuit is coupled to the word lines. The input circuit is configured to set each word line at an activating voltage or at an inactivating voltage according to a corresponding input signal. The readout circuit is coupled to the bit lines and is configured to: receive a plurality of first sum signals respectively from the bit lines; and multiply the plurality of first sum signals by a first input value to generate a plurality of second sum signals.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A control circuit, configured to control operations of a memory array, the control circuit comprising:
   an input circuit configured to:
      receive a plurality of input signals respectively driving a plurality of word lines of the memory array;
      select at least one first input signals having a first input value; and
      provide an activating voltage to at least one first word lines corresponding to the at least one first input signals in a first period; and
   a readout circuit coupled to a plurality of bit lines of the memory array, the readout circuit being configured to calculate a plurality of output sum signals according to the first input value,
   wherein the input circuit is configured to transform each of the input signals with multiple bits into a corresponding driving signal with single bit, to drive the corresponding word line.

2. The control circuit of claim 1, wherein the first input value is not zero.

3. The control circuit of claim 1, comprising:
   a flag control circuit configured to provide a flag signal to the input circuit, to inform the input circuit selecting the at least one first input signals having the first input value.

4. The control circuit of claim 3, wherein the readout circuit comprises:

a plurality of configurable adders configured to:
      receive a plurality of first sum signals from the plurality of bit lines; and
      multiply the plurality of first sum signals by the first input value as indicated by the flag signal to generate a plurality of second sum signals; and
   a plurality of accumulators respectively coupled to the plurality of configurable adders, the accumulators being configured to accumulate the plurality of second sum signals received in different periods to generate the plurality of output sum signals.

5. The control circuit of claim 1, wherein the input circuit comprises:
   a first filter circuit configured to:
      receive the plurality of input signals and select the at least one first input signals having the first input value from the plurality of input signals; and
      providing at least one filter signals corresponding to the at least one first input signals at the activating voltage to activate the at least one first word lines.

6. The control circuit of claim 5, wherein when the at least one first input signals are a plurality of first input signals and the first filter circuit is configured to select all of the first input signals having the first input value to provide a plurality of first filter signals at the activating voltage, the input circuit further comprises:
   a second filter circuit configured to:
      receive the plurality of first filter signals;
      divide the plurality of first filter signals into a plurality groups of second filter signals when a total number of the first filter signals is greater than a predetermined number; and
      provide the plurality groups of second filter signals to the corresponding word lines respectively in a plurality of second periods.

7. The control circuit of claim 6, wherein the second filter circuit comprises:
   a cycle counter configured to:
      calculate a total cycle count by dividing the total number of the activated first filter signals by the predetermined number;
      record a cycle count of how many groups of the second filter signals are provided to the corresponding word lines; and
      provide a finishing signal to a flag control circuit when the recorded cycle count reaches the total cycle count.

8. An operating method of a memory system, the memory system comprising a control circuit and a memory array, the operating method comprising:
   receiving a plurality of input signals respectively driving a plurality of word lines of the memory array;
   selecting at least one first input signals having a first input value;
   providing an activating voltage to at least one first word lines corresponding to the at least one first input signals in a first period;
   calculating a plurality of output sum signals according to the first input value; and
   transforming each of the input signals with multiple bits into a corresponding driving signal with single bit, to drive the corresponding word line.

9. The operating method of claim 8, wherein the first input value is not zero.

10. The operating method of claim 8, comprising:
   using a flag signal corresponding to the first input value for selecting the at least one selected first input signals.

11. The operating method of claim 10, comprising:

receiving a plurality of first sum signals from a plurality of bit lines;

multiplying the plurality of first sum signals by the first input value as indicated by the flag signal to generate a plurality of second sum signals; and accumulating the plurality of second sum signals received in different periods to generate the plurality of output sum signals.

12. The operating method of claim 8, comprising:

receiving the plurality of input signals and selecting the at least one first input signals having the first input value from the plurality of input signals; and providing at least one first filter signals corresponding to the at least one first input signals at the activating voltage to activate the at least one first word lines.

13. The operating method of claim 12, wherein when the at least one first input signals are a plurality of first input signals, all of the first input signals having the first input value are selected to generate a plurality of first filter signals at the activating voltage, the operating method comprises:

receiving the plurality of first filter signals;

dividing the plurality of first filter signals into a plurality groups of second filter signals when a total number of the first filter signals is greater than a predetermined number; and providing the plurality groups of second filter signals to the corresponding word lines respectively in a plurality of second periods.

14. The operating method of claim 13, comprising:

calculating a total cycle count by dividing the total number of the first filter signals by the predetermined number;

recording a cycle count of how many groups of the second filter signals are provided to the corresponding word lines; and providing a finishing signal when the recorded cycle count reaches the total cycle count.

15. A memory system, comprising:

a memory array, comprising a plurality of memory cells, a plurality of word lines, and a plurality of bit lines, each memory cell being coupled to the corresponding word line and the corresponding bit line; and a control circuit, comprising:

an input circuit coupled to the word lines, the input circuit being configured to transform a corresponding input signal with multiple bits into a corresponding driving signal with single bit to set each word line at an activating voltage or at an inactivating voltage; and a readout circuit coupled to the bit lines, the readout circuit being configured to:

receive a plurality of first sum signals respectively from the bit lines; and multiply the plurality of first sum signals by a first input value to generate a plurality of second sum signals.

16. The memory system of claim 15, wherein the readout circuit comprises:

an analog-to-digital converter (ADC) coupled to the plurality of bit lines, the ADC being configured to convert the plurality of first sum signals from analog to digital.

17. The memory system of claim 15, wherein the readout circuit comprises:

a plurality of configurable adder configured to multiply the plurality of first sum signals by the first input value to generate the plurality of second sum signals.

18. The memory system of claim 17, wherein the readout circuit comprises:

a plurality of accumulators respectively coupled to the plurality of configurable adders, the accumulators being configured to accumulate the plurality of second sum signals received in different periods to generate a plurality of output sum signals.

19. The memory system of claim 17, wherein the control circuit comprises:

a flag control circuit configured to provide a flag signal to the input circuit, to inform the input circuit selecting at least one input signal having the first input value.

20. The memory system of claim 17, wherein the input circuit comprises:

a first filter circuit configured to:

receive a plurality of input signals and select at least one first input signals having the first input value from the plurality of input signals; and providing at least one filter signals corresponding to the at least one first input signals at the activating voltage to activate at least one first word lines corresponding to the at least one first input signals.

* * * * *